United States Patent [19]
Lee et al.

[11] Patent Number: 5,563,827
[45] Date of Patent: Oct. 8, 1996

[54] WORDLINE DRIVER FOR FLASH PLD

[75] Inventors: Napoleon W. Lee, Milpitas; Derek R. Curd; Wei-Yi Ku, both of San Jose; Sholeh Diba, Los Gatos; George Simmons, Sunnyvale, all of Calif.

[73] Assignee: Xilinx, Inc., San Jose, Calif.

[21] Appl. No.: 533,412

[22] Filed: Sep. 25, 1995

[51] Int. Cl.$^6$ .................................................. G11C 13/00
[52] U.S. Cl. ......................... 365/185.23; 365/185.33; 365/189.02; 365/230.02; 365/226; 326/39; 326/41
[58] Field of Search .................. 365/185.23, 185.33, 365/189.02, 230.02, 226; 326/39, 41

[56] References Cited

U.S. PATENT DOCUMENTS

5,392,253  2/1995  Atsumi et al. ................. 365/185.23 X
5,399,928  3/1995  Lin et al. ...................... 365/185.23 X

*Primary Examiner*—Do Hyun Yoo
*Attorney, Agent, or Firm*—Arthur J. Behiel; Jeanette S. Harms

[57] ABSTRACT

A wordline driver for a wordline in an integrated programmable logic device (PLD) having flash memory cells. The wordline driver includes an input terminal that accepts a binary wordline input signal, a pass gate coupled to the input terminal and to a mode-control terminal, and an inverter that receives an input from the pass gate or the mode-control terminal, depending on the operating mode of the PLD. The output signal from the inverter is coupled to a multiplexer that selects between that output and a signal from a voltage supply, the signal selected depending on the operating mode of the PLD. The multiplexer outputs the selected signal to the wordline of the PLD.

10 Claims, 8 Drawing Sheets

| | MODE | AWL | EWL | PGMGDHH | PGMGD | VPV | SAT | DEN | DENHH | CPVDCE | WLS |
|---|---|---|---|---|---|---|---|---|---|---|---|
| 1 | LOGIC | $\overline{Win}$ | $V_{PV}$ | 0 | $V_{CC}$ | $V_{CC}$ | 5 | 5 | $V_{PV}$ | 0 | 5 |
| 2 | CONLOAD | $V_{CC}-V_t$ | $V_{PV}$ | 0 | $V_{CC}$ | $V_{CC}$ | 5 | 0 | $V_{PV}-2V_t$ | 5 | 5 |
| 3 | | 0 | 0 | 0 | $V_{CC}$ | $V_{CC}$ | 5 | 0 | $V_{PV}-2V_t$ | 5 | 0 |
| 4 | GD | $V_{PV}-V_t$ | $V_{PV}$ | $V_{PV}$ | 0 | 12 | 5 | 0 | $V_{PV}-2V_t$ | 5 | 0 |
| 5 | SAT | $\overline{Win}$ | $V_{PV}$ | 0 | $V_{CC}$ | $V_{CC}$ | 0 | 0 | $V_{PV}-2V_t$ | 0 | 5 |
| 6 | | 0 | 0 | 0 | $V_{CC}$ | $V_{CC}$ | 5 | 0 | $V_{PV}-2V_t$ | 0 | 0 |
| 7 | PGM | $V_{PV}-V_t$ | $V_{PV}$ | $V_{PV}$ | 0 | 12 | 5 | 0 | $V_{PV}-2V_t$ | 5 | 5 |
| 8 | | 0 | 0 | $V_{PV}$ | 0 | 12 | 5 | 0 | $V_{PV}-2V_t$ | 5 | 0 |
| 9 | VFY | $V_{CC}-V_t$ | $V_{PV}$ | 0 | $V_{CC}$ | 2 or 8 | 5 | 0 | $V_{PV}-2V_t$ | 5 | 5 |
| 10 | | 0 | 0 | 0 | $V_{CC}$ | 2 or 8 | 5 | 0 | $V_{PV}-2V_t$ | 5 | 0 |
| 11 | ERASE | 0 | 0 | 0 | $V_{CC}$ | 12 | 5 | 0 | $V_{PV}-2V_t$ | 5 | 5 |
| 12 | | 0 | $V_{PV}$ | 0 | $V_{CC}$ | 12 | 5 | 0 | $V_{PV}-2V_t$ | 5 | 5 |
| 13 | GANG | $V_{PV}-V_t$ | $V_{PV}$ | $V_{PV}$ | 0 | 12 | 5 | 0 | $V_{PV}-2V_t$ | 5 | 0 |
| 14 | | 0 | 0 | $V_{PV}$ | 0 | 12 | 5 | 0 | $V_{PV}-2V_t$ | 5 | 5 |
| 15 | BLKCHK | $V_{CC}-V_t$ | $V_{PV}$ | 0 | $V_{CC}$ | 2 | 5 | 0 | $V_{PV}-2V_t$ | 5 | 0 |
| 16 | | 0 | 0 | 0 | $V_{CC}$ | 2 | 5 | 0 | $V_{PV}-2V_t$ | 5 | 0 |

FIG. 7

WORDLINE DRIVER FOR FLASH PLD

CROSS-REFERENCES TO RELATED APPLICATIONS

The present application is related to application Ser. No. 08/533,131 filed on the same date as this application, entitled "Programmable Logic Device With Configurable Power Supply," by inventors Napoleon W. Lee, Derek R. Curd, Sholeh Diba, Prasad Sastry, Mihai Statovici, and Kameswara K. Rao (attorney docket number X-172), and to application Ser. No. 08/533,413 also filed on the same date as this application, entitled "High-Voltage Power Multiplexor," by Derek R. Curd (attorney docket number X-199), both of which are incorporated herein by this reference.

BACKGROUND

1. Field Of the Invention

This invention relates generally to programmable logic arrays, and particularly to a programmable logic array that includes flash memory cells.

2. Description of the Related Art

Programmable logic devices (PLDs) are well-known programmable integrated circuits that may be used to replace discrete logic components. PLDs employ a number of competing architectures, all of which have evolved from the basic AND/OR plane architecture. (A species of the basic AND/OR plane architecture is described below in connection with FIG. 2a.)

Numerous types of memory elements may be used in PLD architectures to provide programmability. One such memory cell, known as a flash memory cell, is both electrically erasable and programmable. A basic flash memory cell 100 is shown in FIG. 1a.

Flash memory cell 100 includes an access transistor 110 and a double-polysilicon storage transistor 120. Storage transistor 120 has a floating polysilicon gate 122 that is isolated in silicon dioxide and capacitively coupled to a polysilicon control gate 124. Storage transistor 120 also has a region of silicon dioxide between the floating gate 122 and a drain 126 that is thin enough to permit electrons to tunnel to and from floating gate 122 when the proper bias voltages are applied to the terminals of storage transistor 120. The region of silicon dioxide is conventionally known as the "tunnel oxide."

Figure 1A:
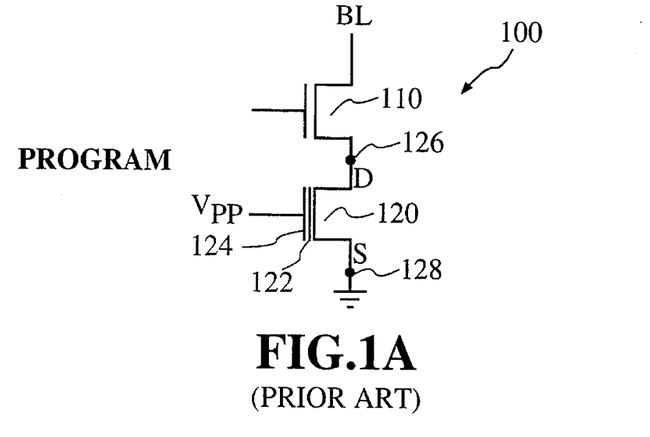
FIGS. 1a, 1b, and 1c show a conventional flash memory cell configured in the program, erase, and verify modes, respectively.

As shown in FIG. 1a, storage transistor 120 is programmed by grounding its source 128, applying approximately 5 to 6 volts to its drain 126, and connecting its control gate 124 to a programming voltage $V_{PP}$ that is high relative to the operating voltage $V_{CC}$. Typical values of the programming voltage $V_{PP}$ and operating voltage $V_{CC}$ are 12 volts and 5 volts, respectively. With storage transistor 120 thus biased, electrons travel through the tunnel oxide to the floating gate 122, leaving the floating gate 122 with a net negative charge. This net negative charge shifts the threshold voltage $V_t$ (i.e., the voltage at which an MOS transistor begins to conduct) of storage transistor 120 in the positive direction to a voltage that is greater than $V_{CC}$.

Figure 1B:
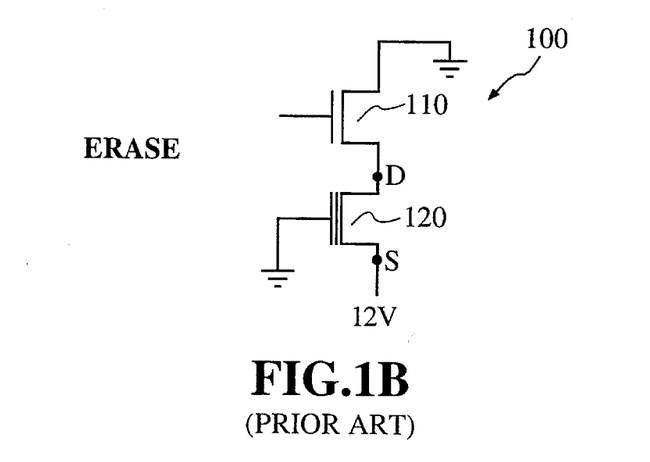

As shown in FIG. 1b, storage transistor 120 is erased by grounding control gate 124 and applying a relatively high voltage (e.g., 12 volts) to the source 128. This bias allows electrons to tunnel away from the floating gate 122 through the tunnel oxide to be swept away by the large positive voltage on the source 128. The loss of electrons (i.e., the loss of negative charge) on floating gate 122 shifts the threshold voltage $V_t$ of storage transistor 120 in the negative direction to a voltage that is less than $V_{CC}$.

When erasing storage transistor 120, it is possible to remove too many electrons from floating gate 122, resulting in excess positive charge on floating gate 122. This condition is commonly known as "over-erase." Access transistor 110 is provided to prevent storage transistor 120, in the event that storage transistor 120 is over-erased, from conducting as a result of excess positive charge on floating gate 122.

When the PLD operates as a logic device, each of the storage transistors (e.g., storage transistor 120) has $V_{CC}$ applied to its control gate 124. The state of each storage transistor may then be "read" by determining whether the storage transistor conducts. If the storage transistor is programmed, $V_{CC}$ is less than the threshold voltage $V_t$ so the storage transistor will not conduct. If, on the other hand, the storage transistor is erased, $V_{CC}$ will be sufficient to turn the storage transistor on.

After flash memory cell 100 is programmed or erased, a test is generally performed to verify the state of storage transistor 120. For example, to verify that storage transistor 120 is properly programmed, a verify-program voltage $V_{VP}$ is applied to the control gate 124 to determine whether the threshold voltage $V_t$ of storage transistor 120 is sufficiently high to keep storage transistor 120 from conducting when $V_{CC}$ is applied to the control gate 124. The verify-program voltage $V_{VP}$ applied to the control gate 124 is greater than $V_{CC}$ by a safety factor of, for example, 3 volts. This safety factor allows for noise and for a possible negative shift of the threshold voltage $V_t$ caused by electrons escaping from the floating gate 122 over the life of memory cell 100.

Figure 1C:
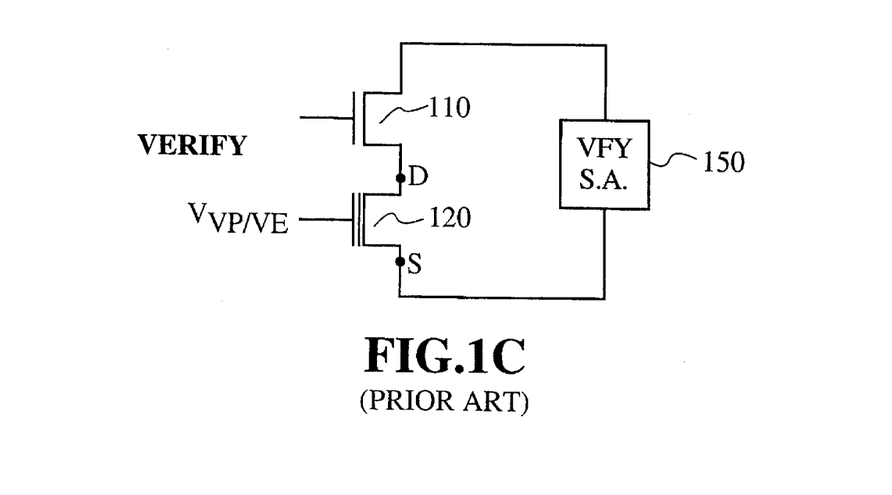

As shown in FIG. 1c, when the programmed or erased state of storage transistor 120 is verified, $V_{CC}$ is applied to the control gate of access transistor 110 to turn access transistor 110 on. A sense amplifier 150, coupled across the series connected access transistor 110 and storage transistor 120, determines whether storage transistor 120 conducts. If the threshold voltage $V_t$ of storage transistor 120 is sufficiently high, over 8 volts for example, a verify-program voltage $V_{VP}$ of 8 volts will not turn storage transistor 120 on. As a result, verify sense amplifier 150 will not sense current through the series coupled transistors 110 and 120.

When storage transistor 120 is erased, the state of erasure may be verified by ensuring that storage transistor 120 conducts with $V_{CC}$ applied to control gate 124. To allow for noise, a verify-erase voltage $V_{VE}$ less than $V_{CC}$ by a safety factor of, for example, 3 volts is applied to control gate 124 of storage transistor 120. $V_{CC}$ is then applied to the control gate of access transistor 110 to allow sense amplifier 150 to access storage transistor 120. If storage transistor 120 is properly erased, verify sense amplifier 150 will detect a current through series transistors 110 and 120 with the two-volt verify-erase voltage $V_{VE}$ applied to the control gate 124 and $V_{CC}$ applied to the control gate of access transistor 110.

Figure 2A:
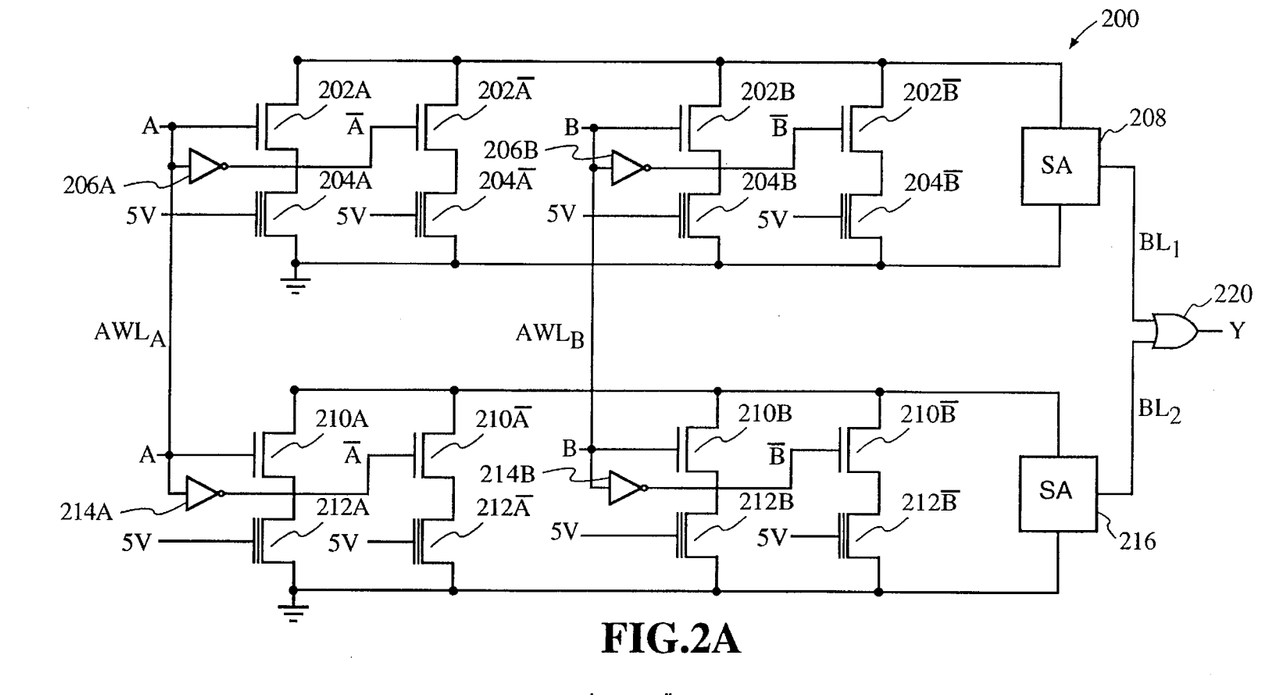
FIG. 2a shows a 2-input AND/OR array 200.

FIG. 2a illustrates a simple 2-input AND/OR array 200 using flash memory cells. AND/OR array 200 and its associated description provide a basic understanding of AND/OR arrays in general. AND/OR array 200 does not represent a functional circuit, and is not admitted prior art.

Array 200 includes eight flash memory cells similar to flash memory cell 100 of FIGS. 1a through 1c. For example, access transistor 202A and storage transistor 204A make up one such cell. Access transistor 202A receives an input A from an access wordline $AWL_A$, and access transistor $202\overline{A}$ receives the complement of signal A ($\overline{A}$) through an inverter 206A.

When AND/OR array 200 is operating as a logic device (i.e., in the "logic mode"), the input voltage on the control gates of all of the storage transistors, for example transistors 204A and 204$^{\overline{A}}$, is $V_{CC}$. As discussed above with respect to FIG. 1, a programmed storage transistor will not conduct with $V_{CC}$ applied to its control gate, whereas an erased storage transistor will. Thus, when AND/OR array 200 operates as a logic device, each programmed storage transistor is effectively an open circuit and each erased storage transistor is effectively a short circuit.

When either of the inputs A or B turns an access transistor on that is connected in series with an erased storage transistor, the sense amplifier coupled across those transistors will sense a current through the series connected transistors and output a low voltage (logic zero) on a corresponding bit line BL. For example, assuming storage transistor 204A is erased, a 5-volt signal on input A will turn access transistor 202A on, creating a current path through series transistors 202A and 204A. Sense amplifier 208 will sense the current through these series coupled transistors and output a low voltage (typically zero volts) on bit line $BL_1$.

Bit lines $BL_1$ and $BL_2$ are connected to an OR gate 220 that outputs, on an output node Y, an OR function of the signals on bit lines $BL_1$ and $BL_2$.

Figure 2B:
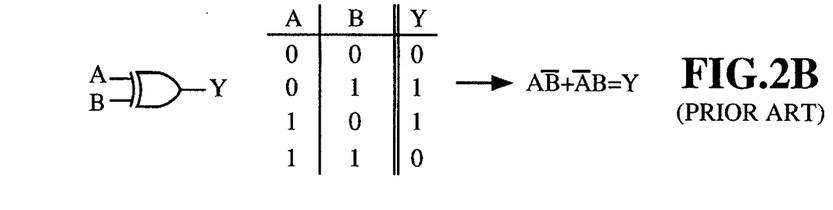
FIG. 2b shows the symbol, truth table, and boolean expression for a conventional exclusive OR gate.

AND/OR array 200 can be programmed to provide at node Y any logic function of the inputs A and B. For example, FIG. 2b shows a conventional exclusive OR gate with inputs A and B, and an output Y. FIG. 2b shows the truth table for the exclusive OR gate and its associated boolean equation. The following example shows how AND/OR array 200 may be programmed to provide an exclusive-OR function of inputs A and B at output node Y.

To program AND/OR array 200, the transistors associated with sense amplifier 208 are programmed to output a logic one, typically 5 volts, when the product term $A\overline{B}$ of the boolean equation is true. To accomplish this, storage transistors 204A and 204$^{\overline{B}}$ are programmed. The other product term, $^{\overline{A}}B$, is simulated using the access and storage transistors associated with sense amplifier 216. To accomplish this simulation, storage transistors 212$^{\overline{A}}$ and 212B are programmed.

Figure 2C:
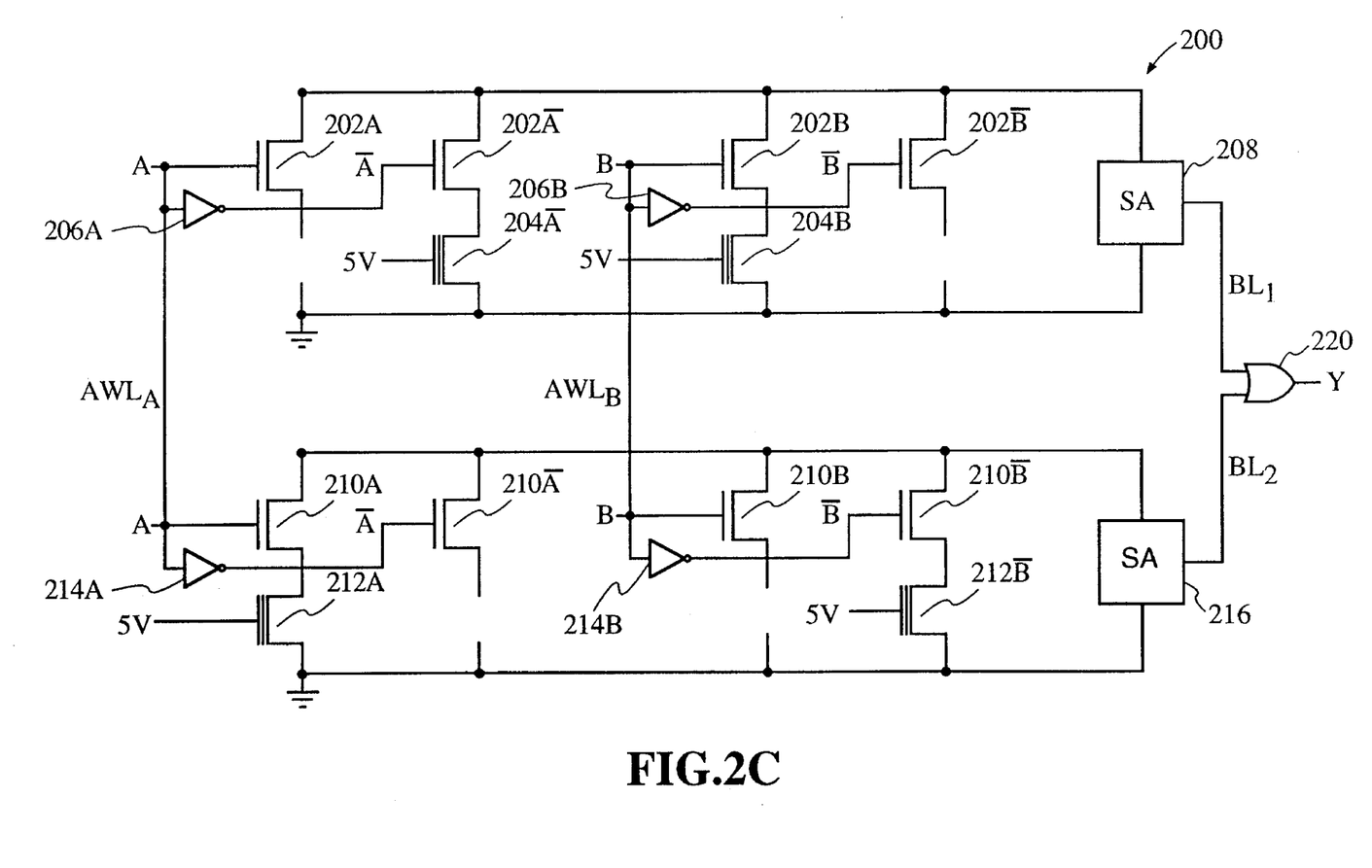
FIG. 2c shows the AND/OR array 200 of FIG. 2a with programmed storage transistors shown as open circuits.

Recalling that a programmed transistor does not conduct with 5 volts applied to its control gate, AND/OR array 200 programmed to act as an exclusive OR gate can be represented by the AND/OR array of FIG. 2c, where programmed storage transistors are shown as open circuits.

AND/OR array 200, as shown programmed in FIG. 2c, operates as an exclusive OR gate as follows:

If input A is a logic zero, then the signal $\overline{A}$ from inverter 206A is a logic one. A logic one on the control gate of access transistor 202$^{\overline{A}}$ will cause access transistor 202$^{\overline{A}}$ to conduct. Because storage transistor 204 is erased, it too will conduct. Therefore, the series connected transistors 202$\overline{A}$ and 204$^{\overline{A}}$ will provide a path for current. Sense amplifier 208 will sense this current and output a logic zero on bit line $BL_1$ to OR gate 220. The logic zero on input A will also be fed via access wordline $AWL_A$ to the transistors associated with sense amplifier 216. Access transistor 210A will not conduct with the logic zero on its control gate, and access transistor 210$^{\overline{A}}$ will not conduct because storage transistor 212$^{\overline{A}}$ is programmed to act as an open circuit. However, the logic zero input on input B is inverted by inverter 214B, so that a logic one is supplied on terminal $\overline{B}$ to the control gate of access transistor 210$^{\overline{B}}$. Access transistor 210$^{\overline{B}}$, thus turned on, will provide a current path through erased storage transistor 212$^{\overline{B}}$. Sense amplifier 216 will sense this current and output a logic zero on bit line $BL_2$. OR gate 220, having a logic zero at each input, will output a logic zero at output Y. Referring back to the truth table of FIG. 2b, the logic zero output is correct when two zeros are input to an exclusive-OR function.

Moving on to the second line of the truth table, when input A is a zero, a logic one on the gate of access transistor 202$\overline{A}$ will cause current to pass through erased storage transistor 204$^{\overline{A}}$. This current will be sensed by sense amplifier 208, which will consequently output a logic zero on bit line $BL_1$ to OR gate 220. A logic one on input B will turn access transistor 210B on, which will fail to conduct because of the nonconducting path provided by storage transistor 212B. The inverted logic one (i.e., logic zero) at signal $\overline{B}$ will be provided to access transistor 210$^{\overline{B}}$, which will consequently not conduct. Sense amplifier 216, having no current path to sense, will output a logic one on bit line $BL_2$ to OR gate 220. OR gate 220, having a logic one on one input, will output a logic one on output node Y. Thus, the second line of the truth table of FIG. 2b is satisfied.

In the third line of the truth table of FIG. 2b, input A is a logic 1 and input B is a logic zero. In this case, access transistor 202A cannot conduct because storage transistor 204A is effectively open, and access transistor 202$^{\overline{A}}$ does not conduct because it is turned off. Furthermore, access transistor 202B does not conduct because it is biased off and access transistor 202$^{\overline{B}}$ cannot conduct because storage transistor 204$^{\overline{B}}$ is effectively an open circuit. Therefore, sense amplifier 208 will output a logic one on bit line $BL_1$, which will cause OR gate 220 to output a logic one on node Y. Thus, the third line of the truth table satisfied.

Finally, the fourth line of the truth table of FIG. 2b requires an output of logic zero when both inputs A and B are logic ones. A logic one on access wordline $AWL_A$ turns access transistor 210A on so that sense amplifier 216 outputs a logic zero on bit line $BL_2$ to OR gate 220. Input B, also a logic one, turns access transistor 202B on so that sense amplifier 208 outputs a logic zero on bit line $BL_1$ to OR gate 220. OR gate 220, having two logic zero inputs, outputs a logic zero on node Y, thus completing the truth table.

Using the programming scheme described above for the exclusive-OR function, AND/OR array 200 may similarly be programmed to represent any other binary function to two inputs. In practice, AND/OR arrays are typically much larger. There may be, for example, 36 wordlines, their associated complements, and 5 bit lines. Such arrays are used to represent complex logic functions.

A number of memory cells are connected in parallel to a single wordline in a conventional PLD. That is, the control terminal of a memory cell is coupled to a number of similar control terminals through a single wordline, much like the control terminals of access transistors 202A and 210A of FIG. 2 are coupled to the same wordline $AWL_A$. Each wordline is driven by a wordline driver.

Figure 3:
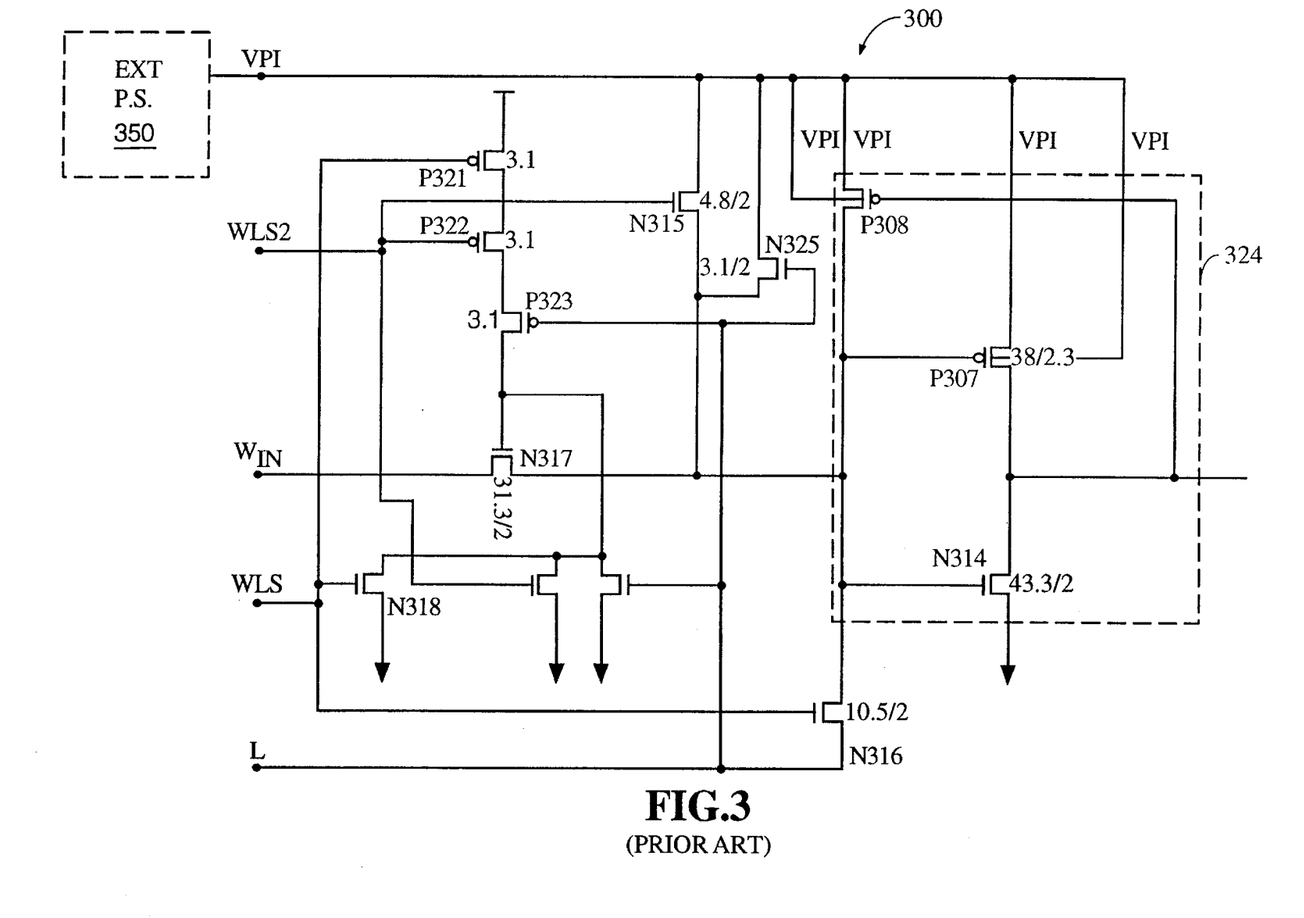
FIG. 3 shows a conventional wordline driver 300 for a UV-erasable, EPROM-based PLD.

FIG. 3 shows a wordline driver 300 used for driving a wordline in the Xilinx XC7300 family of UV-erasable, EPROM-based PLDs. Those PLDs employed UV-erasable EPROM transistors as memory cells. Wordline driver 300 is used to drive a wordline that is similar in function to wordline $AWL_A$ of FIG. 2. However, the wordline output WL of wordline driver 300 is coupled directly to the control gates of the EPROM transistors instead of to an access transistor because EPROM transistors do not require an access transistor.

Wordline driver 300 generally provides two functions. First, it drives a wordline WL with a binary wordline input signal on wordline input terminal $W_{IN}$. Each wordline driver is provided with a separate signal $W_{IN}$, and each of these signals may be logically combined. Second, wordline driver 300 provides the voltages necessary to program its associated memory cells. Because the UV-erasable EPROM transistors driven by wordline driver 300 are not electrically erasable, the erase voltages necessary to erase a flash memory cell are not supplied.

Wordline drivers must accommodate a number of operational modes. Examples of such modes are the program and program-verify modes described above with respect to FIG. 1.

Wordline driver 300 includes input terminals L, WLS, and WLS2. These input terminals and their associated transistors are used to select the mode in which the wordline driver 300 operates. For purposes of this illustration, it is only important to note that when the signals present on input terminals L, WLS, and WLS2 are all zero volts, transistors P321, P322, and P323 are conducting, and therefore allow the voltage $V_{CC}$, typically 5 volts, to turn pass transistor N317 on. This allows the input signal on terminal $W_{IN}$ to pass through pass transistor N317 to a CMOS inverter 324. Inverter 324 includes transistors P307, P308, and N314. Transistors P307 and N314 form a conventional two-transistor CMOS inverter. Transistor P308 is coupled between the input and the output of the two-transistor CMOS inverter to form a conventional half-latch, which serves to restore the voltage level of the signal from input terminal $W_{IN}$ after it passes through pass transistor N317. Inverter 324 provides the inverted $W_{IN}$ signal on wordline WL. In this mode, $V_{CC}$ is supplied to inverter 324, transistor N315, and transistor N325 from an external power supply 350 via input terminal VPI.

In the program mode, the input signals on input terminals L and WLS2 are approximately zero volts, and the input signal on terminal WLS is approximately 5 volts. The 5 volt signal on input terminal WLS turns transistor P321 off and transistor N318 on, thereby supplying zero volts to the control gate of transistor N317. Transistor N317 therefore does not conduct, and affectively isolates inverter 324 from the input signal $W_{IN}$. Also during the program mode, external power supply 350 provides a programming voltage, typically 12 volts, to input terminal VPI. The 5 volt signal on terminal WLS turns transistor N316 on, thereby pulling the input of inverter 324 toward zero volts (the signal on terminal L) and turning transistor P307 on. Transistor P307 conducts the programming voltage from terminal VPI to wordline WL.

Conventional wordline driver 300 is deficient in some respects. In addition to $V_{CC}$, it requires a second external source voltage for supplying the programming voltage on terminal VPI. This is undesirable because it requires an additional power supply voltage. To circumvent similar problems, other devices use on-chip voltage generators, such as charge pumps, to generate programming voltages greater than $V_{CC}$. However, such devices require a switch (e.g., a multiplexer) to select between the externally supplied $V_{CC}$ and the internally generated programming voltage. Because of the impedance inherent in such switches, power supply signals delivered through such switches cannot deliver the level of power that a direct connection to an external power supply can provide. Hence, these switches tend to slow the operation of wordline drivers using on-chip generators.

SUMMARY OF THE INVENTION

A wordline driver in accordance with the present invention allows for in-system programmability without requiring an external programming-voltage power supply. The present wordline driver also provides an optimized speed path for wordline input signals, ensuring maximum device speed in the logic mode.

The present wordline driver includes a pass gate that is coupled to the wordline input terminal and that has a control gate coupled to a mode-decoder. The mode decoder selectively allows the pass gate to pass the signal on the wordline input depending on the mode in which the PLD is operating. For example, in the logic mode, the mode decoder allows the pass gate to pass the digital logic signal from the wordline input.

The output of the pass gate is coupled through an inverter to an input of a multiplexer. Depending on the mode in which the PLD is operating, the multiplexer provides either the output signal from the inverter or one of several voltage levels (e.g., a programming voltage in the program mode) to the control gate of the access transistor associated with the selected flash memory cell.

The pass gate and the inverter are the primary components of the speed path that conveys logic signals on the wordline input to the control gate of the associated access transistors. This speed path is optimized by, for example, supplying the pass gate and inverter circuitry with the voltage level $V_{CC}$ directly from an external power supply and optimizing the aspect ratio (i.e., the ratio of channel width to channel length) of those transistors directly in the speed path.

While the advantages of the present invention are described in connection with a wordline driver in a PLD that uses flash memory cells as storage elements, the speed-enhancing features of the present invention are applicable to line-drivers in general.

DETAILED DESCRIPTION

Figure 4:
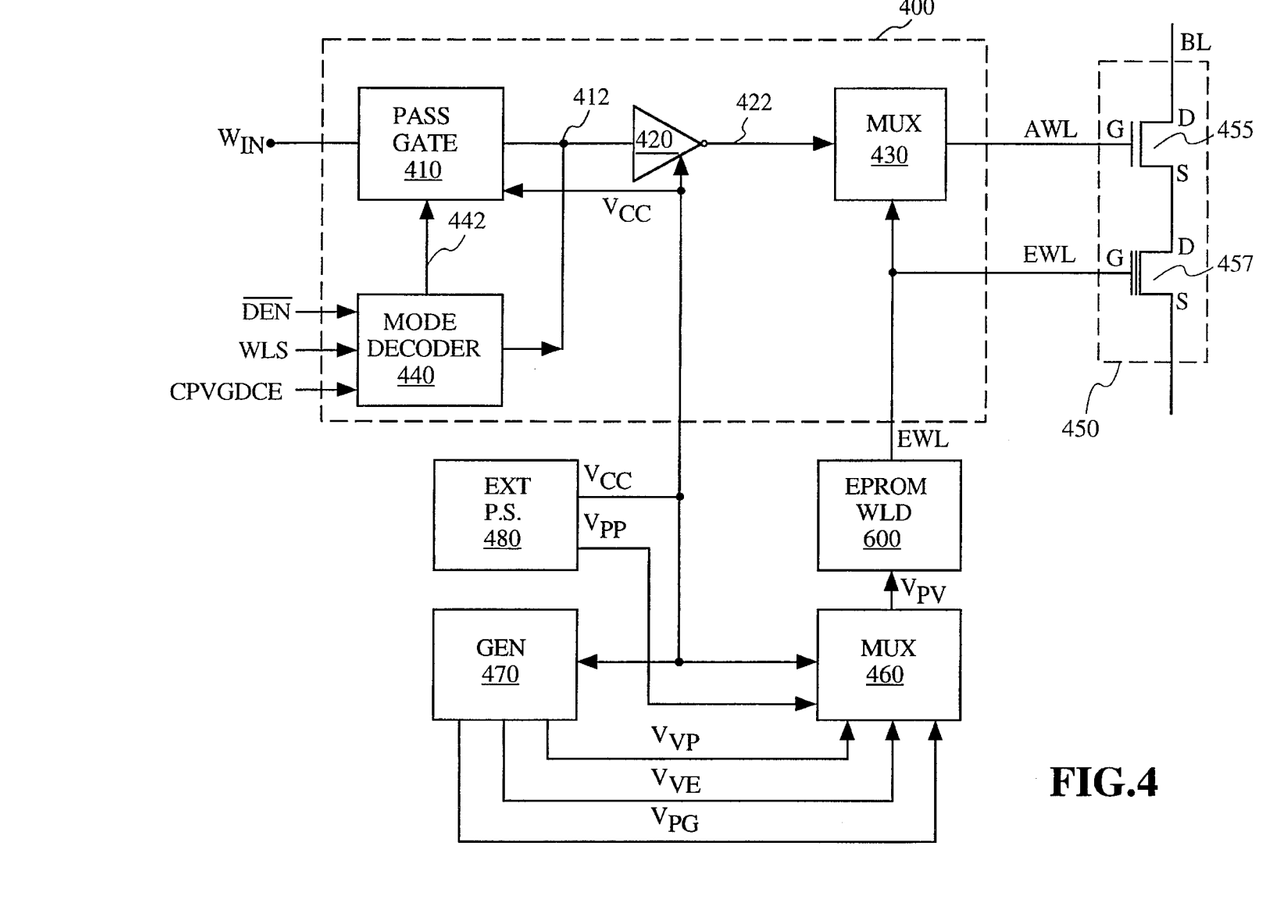
FIG. 4 shows an access-gate wordline driver 400 in accordance with the present invention coupled to a flash memory cell 450, a multiplexer 460, an on-chip voltage generator 470, and an external power supply 480.

FIG. 4 shows a block diagram of an access-gate wordline driver 400 in accordance with the present invention coupled to a flash memory cell 450, program/program-verify/erase-verify voltage multiplexer 460, an on-chip voltage generator 470, and an external power supply 480. Access-gate wordline driver 400 includes a pass gate 410, an inverter 420, multiplexer 430, and a mode decoder 440. Memory cell 450 is similar to flash memory cell 100 of FIG. 1, and includes an access transistor 455 and a storage transistor 457. The control gate G of storage transistor 457 is coupled to a flash-EPROM wordline driver 600, which is discussed in connection with FIG. 6.

Pass gate 410 receives a binary input signal from a wordline input terminal $W_{IN}$. Pass gate 410 also receives an input signal from mode decoder 440, and has an output terminal coupled to a node 412. Depending on the mode selected (e.g., the logic, program, erase, or verify modes), mode decoder 440 either allows pass gate 410 to provide the input signal on wordline terminal $W_{IN}$ to node 412, or itself provides either 5 or zero volts on node 412. The various modes and associated voltage requirements are discussed below in detail with reference to FIGS. 5, 6, and 7.

Node 412 is coupled to the input terminal of inverter 420, which has an output terminal 422 coupled to multiplexer 430. Depending on the signal level on terminal PGMGDHH and on its complement $\overline{PGMGD}$, multiplexer 430 provides either the signal on a program/verify terminal $V_{PV}$ or the signal on output terminal 422 to the control gate G of access transistor 455. PGMGD stands for "program/gate disturb," which indicates that the signals on terminal PGMGDHH and $\overline{PGMGD}$ are active during the program and gate disturb modes. (These and other modes are explained in detail with reference to FIGS. 5 through 7.) The "HH" ending on, for example, the terminal designation PGMGDHH indicates that the terminal has a relatively high voltage swing, e.g., 12 volts (as compared to other terminals, which have a voltage swing of 5 volts). The line over, for example, the terminal designation $\overline{PGMGD}$ conventionally indicates that the terminal is an active low.

Depending on the operational mode of the PLD, multiplexer 460 selects either one of the voltages from on-chip generator 470 (e.g., a programming voltage $V_{PG}$, a verify-program voltage $V_{VP}$, or a verify-erase voltage $V_{VE}$) or $V_{CC}$ from external power supply 480 and provides the selected voltage on program/verify terminal $V_{PV}$ to multiplexer 430. In another embodiment, external power supply 480 may supply multiplexer 460 with a programming voltage $V_{PP}$ in addition to the voltage $V_{CC}$. The supply voltage $V_{CC}$ is connected directly to inverter 420 and pass gate 410 from external power supply 480 to ensure high-speed operation of pass gate 410 and inverter 420.

In the logic mode (i.e., when the PLD is acting as a logic circuit) mode decoder 440 supplies an enabling voltage on line 442 to the control terminal of pass gate 410. Pass gate 410 then passes the signal from terminal $W_{IN}$ to node 412. The signal on node 412 is then inverted by inverter 420 and supplied to an input terminal of multiplexer 430. The signal on terminal PGMGDHH and its complement on terminal $\overline{PGMGD}$ enable the multiplexer 430 to pass the signal on output node 422 of inverter 420 to the control terminal of access transistor 455 via the access-gate wordline AWL. Thus, the control gate G of access transistor 455 receives as input an inverted form of the wordline input signal on terminal $W_{IN}$. Also in the logic mode, the control gate G of storage transistor 457 receives a 5-volt signal on EPROM wordline EWL. The circuitry used to provide the input to the EPROM wordline EWL is discussed below in connection with FIGS. 6 and 7.

In other modes, such as the program and verify modes, mode decoder 440 supplies a signal on line 442 that inhibits pass gate 410. The signals on terminals PGMGDHH and $\overline{PGMGD}$ route the voltage supplied on program/verify terminal $V_{PV}$, 12 volts in the program mode for example, to the control gate G of access transistor 455 via access-transistor wordline AWL. Importantly, because the programming voltage supplied on terminal $V_{PV}$ is generated internally, there is no longer a need for an external programming voltage $V_{PP}$. However, when an external programming voltage is made available, one embodiment of the invention uses multiplexer 460 to select the externally generated programming voltage $V_{PP}$ to take advantage of the additional power to speed device operation.

Figure 5:
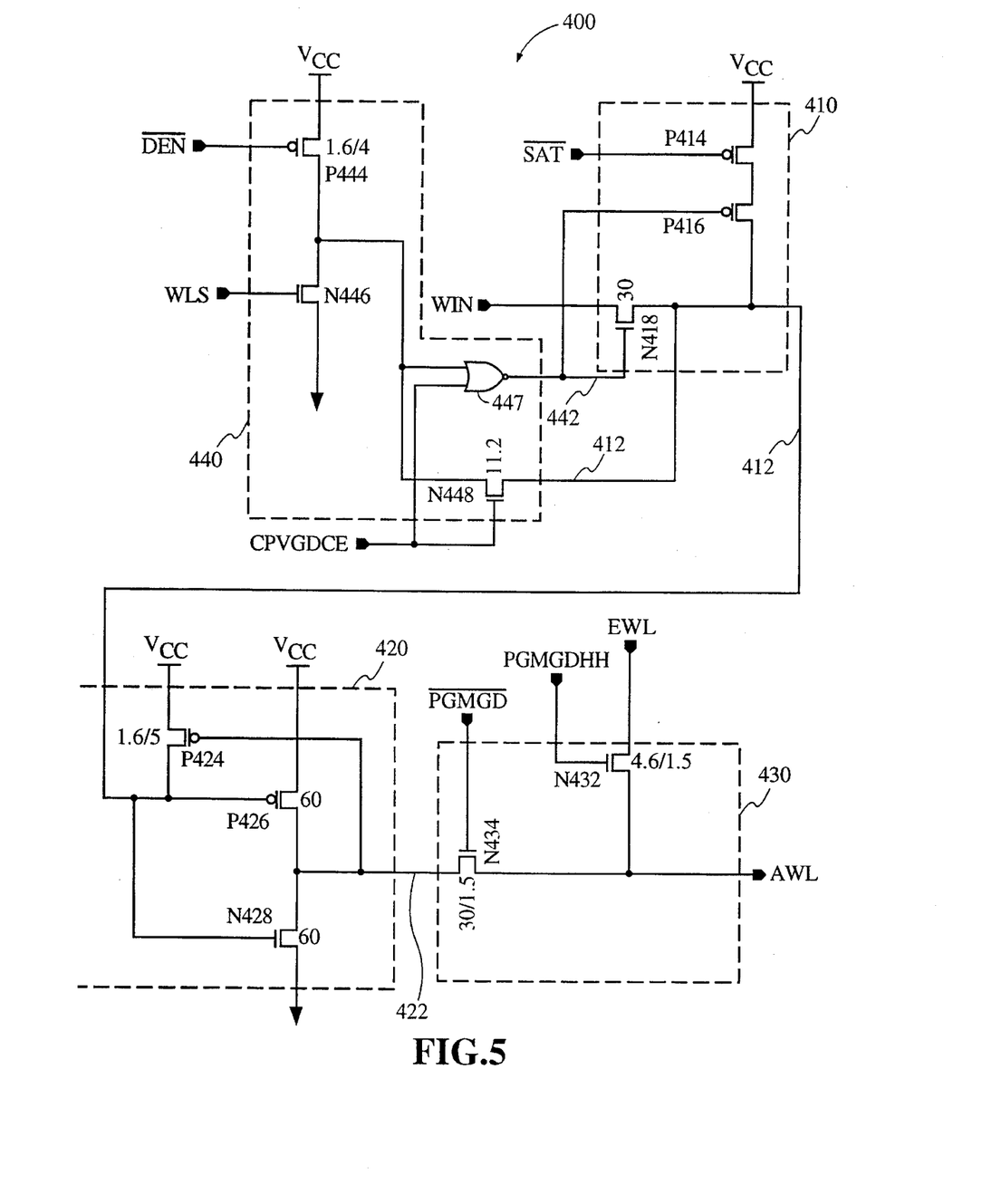
FIG. 5 is a schematic diagram of an access-gate wordline driver 400 in accordance with one embodiment of the present invention.

FIG. 5 is a schematic diagram of an access-gate wordline driver 400 in accordance with one embodiment of the present invention. PMOS transistors are conventionally designated by a "bubble" on their gate and by the letter P preceding their reference number, and NMOS transistors are designated by an N preceding their reference number. Additional numbers represent the aspect ratio (i.e., the ratio of channel width to channel length) for the associated transistors. Where no denominator is provided for the aspect ratio (e.g., transistor 448 has an aspect ratio of 11.2), the denominator is one. Those transistors lacking an aspect-ratio designation, such as transistor N446, have an aspect ratio of 2.4.

Mode decoder 440 includes a transistor P444 having its drain coupled to the drains of transistors N446 and N448. The source of transistor P444 is coupled to $V_{CC}$ and the control terminal is coupled to a decode enable terminal $\overline{DEN}$. When zero volts is applied to terminal $\overline{DEN}$, the weak transistor P444 acts as a pull-up resistor for the line coupled to its drain terminal.

The source of transistor N446 is coupled to ground and the gate of transistor N446 is connected to the wordline-select terminal WLS. A two-input NOR gate 447 has one input coupled to the drains of transistors P444, N446, and N448, and the other input coupled to the control terminal of a transistor N448 and an input terminal CPVGDCE. (CPVGDCE stands for the modes CONLOAD, PROGRAM, VERIFY, GATE DISTURB, and DC ERASE. These and other modes are discussed in detail with respect to FIG. 7.)

Pass gate 410 receives the outputs from mode decoder 440 on lines 442 and 412. Pass gate 410 also receives a wordline input signal on wordline input terminal $W_{IN}$ and a sense amplifier test (SAT) signal on terminal $\overline{SAT}$. Pass gate 410 also includes transistors P414, P416 and N418. Transistors N418 and P416 receive an input on their respective control terminals from the output of NOR gate 447 of mode decoder 440. Transistor N418 has one current-handling terminal coupled to terminal $W_{IN}$ and a second current-handling terminal coupled to the drain of transistor P416 and to line 412 from mode decoder 440. The source of transistor P416 is coupled to the drain of transistor P414, and the source of transistor P414 is coupled to $V_{CC}$. The control terminal of transistor P414 is coupled to terminal $\overline{SAT}$. Finally, the output pass gate 410 is input to inverter 420 by way of an output line 412.

Inverter 420 includes transistors P424, P426, and N428. Transistors P426 and N428 receive the output of pass gate 410 on their control terminals and function as a conventional CMOS inverter, the output of which is taken from the drains of transistors P426 and N428. Transistor P424 is coupled between the input and the output of the CMOS inverter and functions as a conventional half-latch to correct for the voltage drop across transistor N418 of pass gate 410.

Multiplexer 430 includes transistors N432 and N434. Transistor N434 receives as input to one of its current-handling terminals the output terminal 422 of inverter 420. The gate of transistor N434 is coupled to terminal $\overline{\text{PGMGD}}$, and the second current-handling terminal is coupled to the access-gate wordline AWL. Transistor N432 has a first current-handling terminal coupled to EPROM wordline EWL, a second current-handling terminal coupled to access-gate wordline AWL, and a control terminal coupled to terminal PGMGDHH. The access-gate wordline AWL is coupled to the control gate G of access transistor 455, as shown in FIG. 4.

Figure 6:
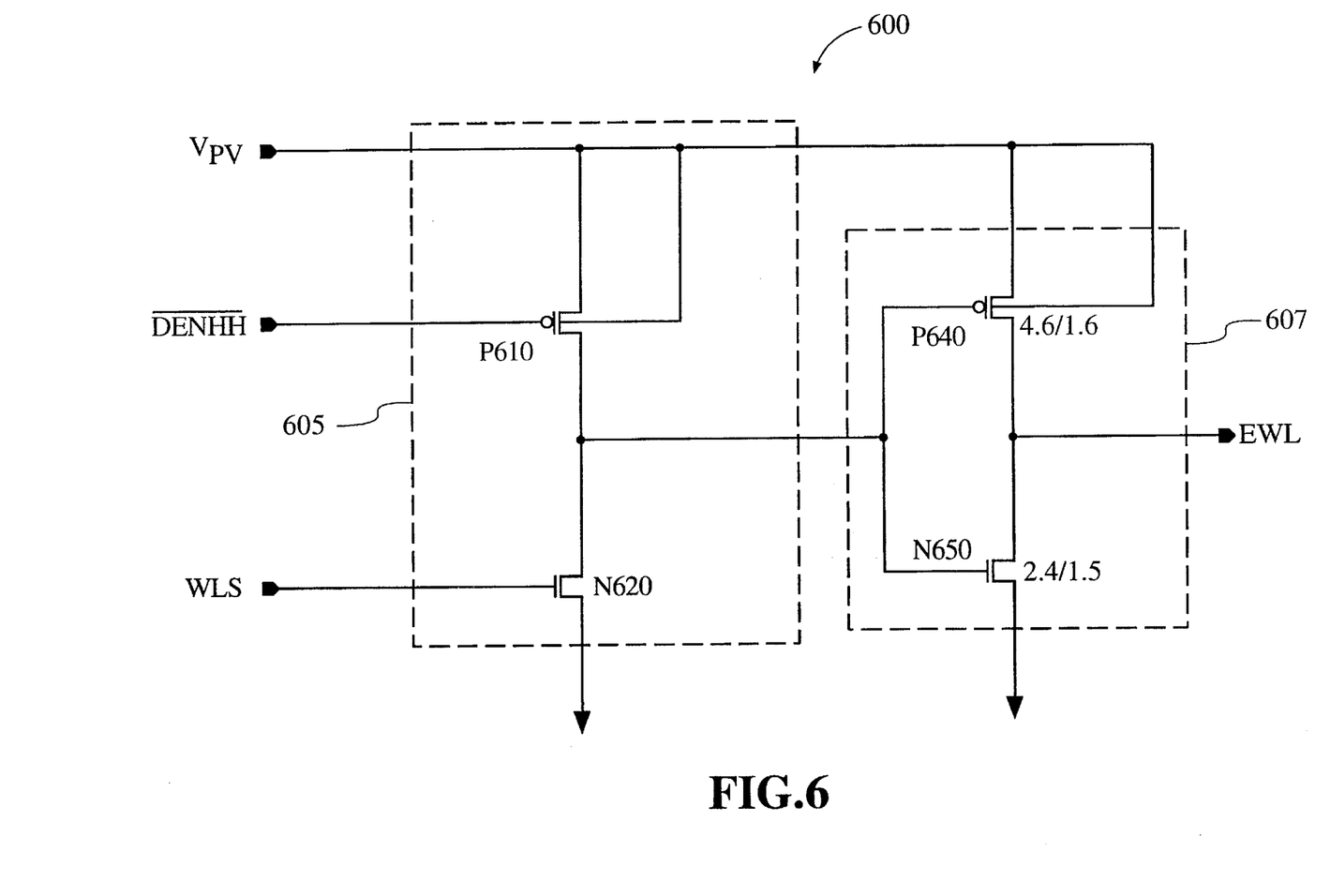
FIG. 6 is a schematic diagram of flash-EPROM wordline driver 600 for driving EPROM wordline EWL of FIG. 4.

FIG. 6 is a schematic diagram of EPROM wordline driver 600 for driving EPROM wordline EWL of FIG. 4. As in FIG. 5, PMOS transistors are designated by a "bubble" on their gate and by the letter P prior to their reference number, and NMOS transistors are designated by an N preceding their number designation. EPROM wordline driver 600 includes decode logic 605 and an inverter 607. Additional numbers represent the aspect ratio for the associated transistors. Those transistors lacking an aspect-ratio designation have an aspect ratio of 2.4.

Decode logic 605 includes transistors P610 and N620. Transistor P610 has its source coupled to program/verify terminal $V_{PV}$, its gate coupled to a high-voltage decode enable terminal $\overline{\text{DENHH}}$, and its drain coupled to the drain of transistor N620. Transistor N620 has its source coupled to ground and its gate coupled to the terminal WLS.

The drains of transistors P610 and N620 are coupled to the input of an inverter 607, a conventional CMOS inverter that includes transistors P640 and P650. CMOS inverter 607 is coupled between the program/verify terminal $V_{PV}$ and ground, and its output is provided to the control gate G of storage transistor 457 of FIG. 4 via EPROM wordline EWL. The operation of EPROM wordline driver 600 is described below in connection with FIG. 7.

Figure 7:
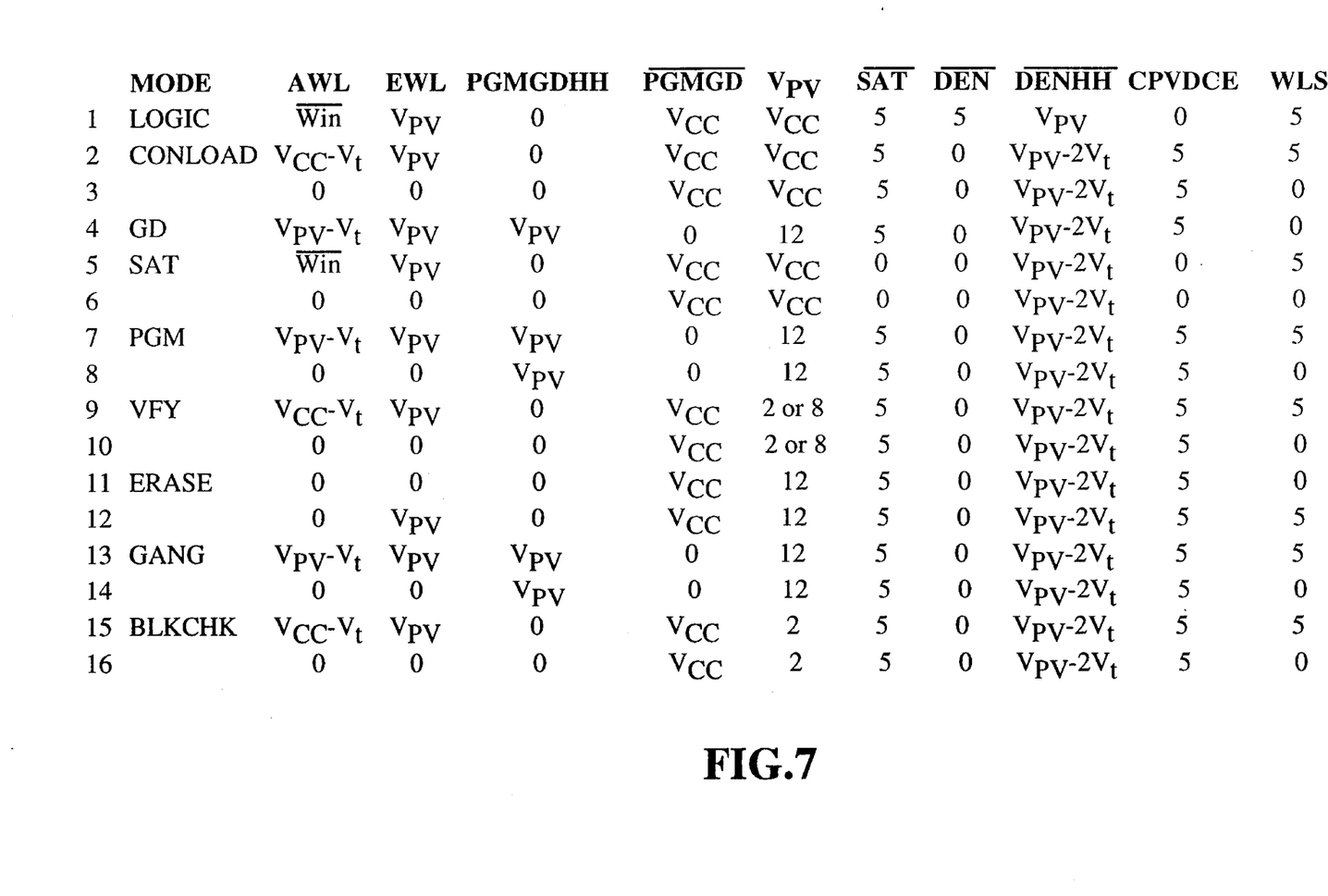
FIG. 7 is a table of signal levels provided to access-gate wordline driver 500 and EPROM wordline driver 600 of FIGS. 5 and 6, respectively.

FIG. 7 is a table of signal levels provided to access-gate wordline driver 500 and EPROM wordline driver 600 of FIGS. 5 and 6, respectively. FIG. 7, in conjunction with FIGS. 5 and 6, describes various modes of operation for access-gate wordline driver 500 and EPROM wordline driver 600. A PLD user, typically a third-party programmer or test engineer, selects a desired mode by supplying appropriate signals to the PLD.

Line number 1 of FIG. 7 indicates signal levels associated with the logic mode, in which the PLD of the present invention acts as a logic device, the type of logic device depending on the program configuration of the storage cells. In this mode, the input signal on terminal $W_{IN}$ is inverted and supplied to the gate of access transistor 455. Also in the logic mode, the control gate G of storage transistor 457 is supplied with 5 volts. If the inverted signal from terminal $W_{IN}$ turns transistor 455 on, current will pass through the series coupled transistors 455 and 457 only if the voltage on control gate 124 is sufficient to overcome the threshold voltage $V_t$ of storage transistor 457. Thus, whether the series connected transistors 455 and 457 conduct depends on the state of storage transistor 120. A sense amplifier (not shown) similar to those of FIG. 2a is coupled between the drain of access transistor 455 and the source of storage transistor 457. This sense amplifier senses whether current passes through the series connected transistors.

While operational speed is important in all modes of PLD operation, speed is generally most important in the logic mode (i.e., when the PLD is imitating discrete logic components). To achieve maximum speed in the logic mode, the path between the wordline input terminal $W_{IN}$ and the gate of access transistor 455 must pass the wordline input signal to access transistor 455 as quickly as possible. For this reason, transistors N418, P426, N428, and N434, which together form the "speed path" for the wordline input signal to propagate from terminal $W_{IN}$ to the access-wordline AWL, have aspect ratios that are high relative to the other transistors in access-gate wordline driver 400. In addition, pass gate 410 and inverter 420 are supplied with $V_{CC}$ directly from an external power supply 480. This direct connection maximizes the power delivered to pass gate 410 and inverter 420, consequently decreasing the response time of pass gate 410 and inverter 420. Access-gate wordline driver 400 thus provides fast signal propagation from the wordline input terminal $W_{IN}$ to the access-gate wordline AWL.

The wordline-select terminal WLS allows each wordline driver to be uniquely selected. As shown in FIG. 7, in the logic mode the signal provided on terminal WLS is 5 volts. This turns transistor N446 on, which pulls one of the inputs to NOR gate 447 towards ground (i.e., to a logic zero). The other input to NOR gate 447, the signal on terminal CPVGDCE, is also a logic zero. The output of NOR gate 447 is therefore a high logic level, and therefore turns transistor N418 on to allow the signal at wordline input terminal $W_{IN}$ to pass through transistor N418. The signal from wordline input terminal $W_{IN}$ continues on to be inverted by inverter 410. Because the signal on terminal $\overline{\text{PGMGD}}$ is high, the signal from inverter 410 passes through transistor N434 to the access wordline AWL.

Referring to FIG. 6, a 5-volt signal is supplied to terminal $V_{PV}$ and, as stated above in connection with FIG. 5, a 5-volt signal is also supplied to terminal WLS. The 5-volt signal on terminal WLS turns transistor N620 on, pulling the input of inverter 607 toward ground. This low voltage on the input of inverter 607 turns transistor P640 on so that the 5-volt signal on terminal $V_{PV}$ is conveyed to EPROM wordline EWL.

When the PLD operates in the logic mode the level of the 5-volt signal at EPROM wordline EWL does not change. Therefore, the current needed to supply this voltage is nominal. For this reason, the fact that the 5-volt signal provided at terminal $V_{PV}$ is provided through multiplexer 460 instead of by direct connection to external power supply 480 does not adversely effect the speed of the PLD.

One PLD in accordance with the present invention includes a group of flash-memory cells conventionally called "configuration bits" (not shown). These configuration bits are used to configure the device, not necessarily affecting the logic functions in the logic mode. For example, one or more configuration bits may be programmed to adjust the program-verify output voltage from on-chip generator 470.

Lines 2 and 3 of FIG. 7 describe the CONLOAD mode, which stands for configuration-load mode. In this mode, the PLD sequentially addresses the access-gate wordline and EPROM wordline associated with each configuration bit. The wordlines are selected when a 5-volt signal is applied to the wordline select terminal WLS for that particular access-gate/EPROM wordline pair. The state of the storage transistor of the configuration bit is read and a latch set to store the contents of that bit. The latch, thus "configured," thereafter provides the output designated by the configuration bit to, in the example above, the on-chip voltage generator 470. The configured latch will retain the configured state as long as power is applied to the latch.

When a particular configuration bit's access-gate/EPROM wordline driver pair is not selected, the voltage on the terminal WLS associated with that wordline driver combination is zero. In such cases, transistor N446 is cut off, allowing one input to NOR gate 447 to be pulled toward $V_{CC}$ (i.e., to a logic one) by transistor P444. This logic one is applied to an input of NOR gate 447, causing the output of NOR gate 447 to go toward zero. The signal CPVGDCE provides a 5-volt signal to the other input of NOR gate 447 and to the gate of transistor N448, both of mode decoder 440. Thus, mode decoder 440 outputs approximately zero volts on line 442 and approximately $V_{CC}$ on line 412.

The low voltage on line 442 cuts off transistor N418, isolating the wordline input $W_{IN}$. The 5-volt signal on line 412 is inverted by inverter 420 so that approximately zero volts is passed by transistor N434 to the access-gate wordline AWL. Similarly, the low voltage on WLS cuts off transistor N620 of FIG. 6 so that the output to EPROM wordline EWL is approximately zero. Thus, in the CONLOAD mode, the access-gate/EPROM wordline drivers corresponding to those configuration bits not selected will have approximately zero volts placed on both their access-gate wordline AWL and EPROM wordline EWL, effectively disabling the flash memory cells of the unselected configuration bits.

If, on the other hand, a particular wordline driver is selected by providing a 5-volt signal on terminal WLS, terminal CPVGDCE will still provide a 5-volt signal so that transistor N418 will continue to isolate wordline input terminal $W_{IN}$ from the input of inverter 420. However, the 5-volt signal on transistor N446 will pull the other input of NOR gate 447 toward zero, and this low signal will be transmitted through transistor N448 to line 412. The low voltage on line 412 is coupled directly to inverter 420, which consequently outputs a logic one (approximately $V_{CC}$) to transistor N434. As shown in FIG. 7, the signal $\overline{PGMGD}$ is $V_{CC}$ in the CONLOAD mode, so that the logic one on the input of transistor N434 is made available on access-gate wordline AWL, enabling the associated access-gate.

Similarly, the 5-volt signal on the gate of transistor N620 will turn transistor N620 on to bring the input of inverter 607 toward zero, consequently driving the output of inverter 607 toward the voltage on terminal $V_{PV}$, which is $V_{CC}$ in the CONLOAD mode. The output of inverter 607 is supplied to the control gate G of the storage transistor associated with the selected configuration bit via wordline EWL. Thus, in the CONLOAD mode, the series connected access-gate and EPROM transistors in the configuration flash-memory cell will provide a path for current only if the EPROM transistor is erased.

Moving to line 4 of FIG. 7, the table shows various signals associated with the gate disturb (GD) mode, which is used to stress erased EPROM cells in order to check the integrity of the EPROM's tunnel oxide. In this mode, the drain of each EPROM is supplied with zero volts while the EPROM wordline EWL (i.e., the control gate of each EPROM) is supplied with approximately 12 volts. Although not shown in the table, all bit lines BL are set to a bit-line voltage of approximately zero volts. As a consequence of the signal levels shown in FIG. 7 for the GD mode, all access-gate wordlines (e.g., access-gate wordline AWL) are at 12 volts minus the threshold voltage $V_t$ of transistor N432 and all EPROM wordlines (e.g., EPROM wordline EWL) are at 12 volts.

In the sense amp test (SAT) mode (line 5 of FIG. 7), a bit-line sense amplifier, such as sense amplifier 208 of FIG. 2, may be used to test individual flash memory cells when all of the memory cells are erased. Assume, for example, that a user wishes to ensure that the memory cell including transistors 202A and 204A of FIG. 2 is properly connected across the inputs to sense amplifier 208. To do this, the user must disable all of the other memory cells so that sense amplifier 208 does not sense current through cells not under test. The remaining cells cannot be disabled by providing a zero input to the remaining access wordlines because each access wordline has a complementary access wordline that would provide the opposite logic level to a complementary access gate. For example, if storage transistors 204B and $204_{\overline{B}}$ are both erased, a logic high on terminal B will provide a current path through transistor 204B, and a logic low on terminal B will provide a current path through transistor 204 $\overline{B}$. In either case, sense amplifier 208 would sense current and output a logic zero on bit line $BL_1$ regardless of whether storage transistor 204A was properly connected across the inputs to sense amplifier 208. Therefore, the SAT mode must disable all of the flash memory cells except the one under test.

Returning to FIG. 5, in the SAT mode a 5-volt signal is applied to the wordline-select terminal WLS of the access-gate/EPROM wordlines associated with the selected flash-memory cell, and a zero-volt signal is applied to the wordline-select terminal WLS of the remaining access-gate/EPROM wordlines. With the remaining wordline-driver input voltages as shown in line 5 of FIG. 7, transistor N418, pass gate 410, inverter 420, and multiplexer 430 pass an inverted form of the signal available on terminal $W_{IN}$ to the access wordline AWL.

The voltage applied to the control gate of the selected access transistor may then be manipulated by changing the level on input terminal $W_{IN}$. The output of the sense amplifier is monitored to determine whether the appropriate output is provided in response to changes in voltage on the input terminal $W_{IN}$. The remaining access-gate/EPROM wordline pairs may then each, in turn, be selected so that their corresponding flash memory cells may be individually tested.

In the program (PGM) mode, the voltages applied to storage transistor 457 are those shown in FIG. 1a for storage transistor 120. The signal levels of FIG. 7, line 7, cause the appropriate programming voltages to be applied to the selected storage transistor. (The levels of line 8 are supplied to those storage transistors not selected to be programmed.) Terminal $\overline{DENHH}$ supplies the voltage on terminal $V_{PV}$ minus approximately twice an MOS threshold voltage $V_t$ (or $V_{PV} - 2V_t$) to the gate of transistor P610. With this voltage, the weak transistor P610 acts as a pull-up resistor for the input to inverter 607.

The verify (VFY) mode is used to verify whether a flash memory cell is properly programmed or properly erased. To achieve this end, multiplexer 460 supplies either an 8-volt signal or a 2-volt signal on terminal $V_{PV}$. A properly programmed cell will not conduct with 8-volts supplied to its control gate, and a properly erased cell will conduct with only 2-volts on its control gate. (The need for the 8 and 2-volt verify signals is discussed above in connection with FIGS. 1a, 1b, and 1c.) The input signals required to provide the necessary verify voltages to a flash memory cell such as flash memory cell 450 are listed in FIG. 7, line 9. While one flash memory cell is being verified, those wordlines associated with memory cells not being verified are deselected by applying a zero-volt signal to terminal WLS, as shown in FIG. 7, line 10.

In the erase mode, the voltages applied to storage transistor 457 must be those shown in FIG. 1b for storage transistor 120. The signal levels of FIG. 7, line 11, cause the appropriate erase voltages to be applied to the selected storage transistor. In addition to the signals shown, 12-volt signal on terminal $V_{PV}$ is applied to the source of storage transistor 457. The levels of line 12 are supplied to those storage transistors not selected to be erased, and are the same as in line 11 except that the wordline-select signal on terminal WLS is 5 and the voltage on the wordline EWL is the 12-volt signal on terminal $V_{PV}$.

A typical PLD using the inventive wordline driver includes a number of function blocks, each of which contains an AND/OR array similar to (but much more complex than) the simple 2-input AND/OR array 200 of FIG. 2. One such PLD, for example, includes 6 such function blocks, each of which may be uniquely programmed in the program (PGM) mode.

In the gang program (GANG) mode, the voltages applied to storage transistor 457 must be those shown in FIG. 1a for storage transistor 120. The signal levels of FIG. 7, line 13, cause the appropriate programming voltages to be applied to the selected storage transistor.

When testing the device, it is generally unnecessary to provide unique program information for each function block. In such cases, test engineers can save valuable time by simultaneously programming all of the function blocks in parallel to represent the same logic configuration. Thus, in the GANG mode, all function blocks are programmed in parallel with the same programming data.

Referring to lines 15 and 16 of FIG. 7, the blank-check (BLKCHK) mode is used to check whether all of the flash memory cells in an array of cells are erased (i.e., "blank"). In the present invention, all of the flash memory cells associated with a given access-gate/EPROM wordline pair of the PLD are simultaneously tested for an erased state by selecting only the access-gate/EPROM wordline pair being checked (e.g., AWL and EWL of FIGS. 5 and 6, respectively) while keeping the voltage on all other access-gate/EPROM wordlines low. All erased flash memory cells driven by high logic levels on their respective access-gate wordline AWL and wordline EWL will respond by conducting current and, consequently, causing the associated sense amplifier to output a logic zero on the associated bit line BL.

If all of the flash memory cells for a given access-gate/EPROM wordline pair are erased, every sense amplifier output signal will be low. If, on the other hand, one or more memory cells on the selected access-gate/EPROM wordline pair are not completely erased, then at least one sense amplifier output signal will be a high logic level because the non-erased memory cell will not conduct, indicating the presence of the memory cell that is not erased. Each access-gate/EPROM wordline pair is selected in turn (using the signal levels of FIG. 7, line 15) to verify whether the associated flash memory cells are erased. Those access-gate/EPROM wordline pairs not selected are treated to the signal levels of FIG. 7, line 16.

The above description is illustrative and not limiting. Further modifications of the above-described wordline driver will be apparent to those skilled in the art. For example, a line driver in accordance with the present invention could be used to drive a wordline in a PLD that uses flash EEPROM transistors as storage elements. Such variations are intended to fall within the scope of the appended claims.

What is claimed is:

1. A line driver for a first line in an integrated programmable logic device, said line driver comprising:

a line input terminal for accepting a binary input signal having a first low logic level and a first high logic level;

a pass gate having a first current-handling terminal coupled to said line input terminal, a second current-handling terminal, and a mode-control terminal receiving a mode-control signal, wherein said first current-handling terminal receives said input signal from said line input terminal and wherein said pass gate passes said input signal when said mode-control signal enables said pass gate;

an inverter having an input terminal coupled to said second current-handling terminal of said pass gate and having an output terminal, wherein said input terminal receives said input signal and said inverter provides an inverted input signal on said output terminal; and a multiplexer having
a first input terminal coupled to said inverter output terminal, said first input terminal for receiving said inverted input signal,
a second input terminal coupled to a voltage source, and
a line output terminal coupled to said first line of said programmable logic device.

2. The line driver of claim 1, wherein said first line of said programmable logic device is coupled to a flash memory cell.

3. The line driver of claim 2, wherein said flash memory cell includes:

an MOS access transistor having a current-handling terminal and having a control terminal coupled to said first line of said programmable logic device; and an EPROM transistor having a current-handling terminal coupled to said current-handling terminal of said access transistor and having a control terminal coupled to a second line.

4. The line driver of claim 2, wherein said flash memory cell includes:

an MOS access transistor having a current-handling terminal and having a control terminal coupled to said first line of said programmable logic device; and an EEPROM transistor having a current-handling terminal coupled to said current-handling terminal of said access transistor and having a control terminal coupled to a second line.

5. The line driver of claim 1, wherein said pass gate and said inverter are coupled to a power supply voltage $V_{CC}$ supplied directly from a power supply external to said programmable logic device, and wherein said voltage source develops a supply voltage different from $V_{CC}$.

6. The line driver of claim 1, wherein a first MOS pass transistor within said pass gate, a pair of complementary MOS transistors in said inverter, and a second MOS pass transistor within said multiplexer comprise a path for conveying said input signal to said line output terminal, and wherein said first and second pass transistors and said complementary MOS transistors have an aspect ratio of greater than 10 to 1.

7. The line driver of claim 1, wherein said pass gate has a voltage drop between its first and second current-handling terminals such that said input signal on said second current-handling terminal is a binary signal having a second high logic level less than said first high logic level, and wherein said inverter includes a half-latch coupled between said output terminal and said input terminal, said half-latch for raising said second high logic level to said first high logic level.

8. The line driver of claim 1, further comprising a mode decoder coupled to said mode-control terminal, whereby said mode decoder generates said mode-control signal in response to user inputs to said device.

9. The line driver of claim 3, wherein said EPROM includes a layer of tunnel oxide, and wherein said second line provides a stress voltage to said control terminal of said EPROM transistor to test said tunnel oxide.

10. A method for driving a line in an integrated programmable logic device having a programming voltage source, said programmable logic device operating in a programming mode and a logic mode, said method comprising the steps of:

selecting one of said programming mode and said logic mode; and if said logic mode of operation is selected,
    providing a binary input signal having a first low logic level and a first high logic level,
    inverting said input signal, and
    selecting said inverted input signal and supplying said inverted input signal to said line; and if said programming mode of operation is selected,
    providing a programming voltage from said programming voltage source, and
    selecting said programming voltage and coupling said programming voltage to said line.

\* \* \* \* \*